(12) United States Patent
Martelloni et al.

(10) Patent No.: US 7,161,824 B2
(45) Date of Patent: Jan. 9, 2007

(54) METHOD FOR PROGRAMMING A MEMORY ARRANGEMENT AND PROGRAMMED MEMORY ARRANGEMENT

(75) Inventors: Yannick Martelloni, Poing (DE); Martin Ostermayr, Felkirchen (DE)

(73) Assignee: Infineon Technologies AG, Munich (DE)

( * ) Notice: Subject to any disclaimer, the term of this patent is extended or adjusted under 35 U.S.C. 154(b) by 73 days.

(21) Appl. No.: 11/115,031

(22) Filed: Apr. 26, 2005

(65) Prior Publication Data

US 2005/0243637 A1    Nov. 3, 2005

(30) Foreign Application Priority Data

Apr. 26, 2004    (DE) .................. 10 2004 020 306

(51) Int. Cl.
*G11C 17/00*    (2006.01)

(52) U.S. Cl. .................. 365/94; 365/63; 365/104; 257/390

(58) Field of Classification Search .................. 365/94, 365/104, 99, 63; 257/390
See application file for complete search history.

(56) References Cited

U.S. PATENT DOCUMENTS

| 5,917,224 | A | 6/1999 | Zangara |
| 5,959,877 | A | 9/1999 | Takahashi |
| 6,771,528 | B1 | 8/2004 | Jeung et al. |
| 6,826,070 | B1 * | 11/2004 | Sung et al. .................. 365/94 |
| 6,861,714 | B1 * | 3/2005 | Lee et al. .................. 257/390 |
| 6,906,942 | B1 * | 6/2005 | Ostermayr .................. 365/104 |
| 2002/0039305 | A1 | 4/2002 | Becker |
| 2002/0179999 | A1 | 12/2002 | Lee et al. |

FOREIGN PATENT DOCUMENTS

| DE | 102 16 223 | 4/2002 |
| DE | 102 18 272 A1 | 4/2002 |

* cited by examiner

*Primary Examiner*—Richard Elms
*Assistant Examiner*—Toan Le
(74) *Attorney, Agent, or Firm*—Brinks Hofer Gilson & Lione

(57) ABSTRACT

A read-only memory arrangement and method for programming the memory arrangement are provided. The memory arrangement includes memory cells, which each have a transistor with two contacts and a control terminal, address lines, bit lines and a potential line. A combination of one of the address lines and one of the bit lines is uniquely assigned to each memory cell. The control terminal of each transistor is connected to the address line assigned to the respective memory cell. To program a memory cell into a first memory state, one of the contacts of the transistor of the memory cell is connected to the assigned bit line and the other of the contacts is connected to the potential line. To program a memory cell into a second memory state, no connections are established between the contacts of the transistor and either the assigned bit line or the potential line.

19 Claims, 2 Drawing Sheets

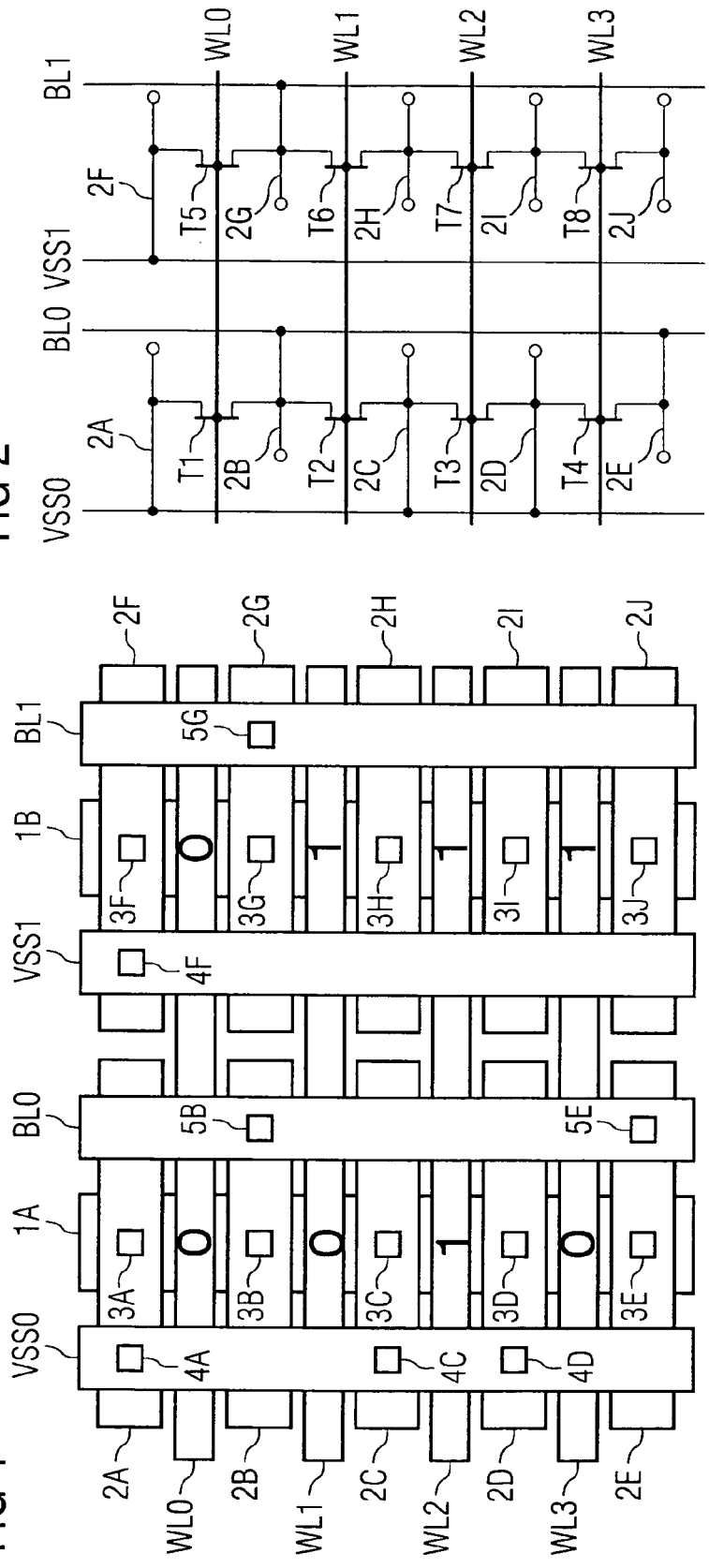

CLAIM FOR PRIORITY

The present application claims the benefit of German Application No. DE 10 2004 020306.7 filed on Apr. 26, 2004, which is hereby incorporated by reference.

TECHNICAL FIELD

The present invention relates to a method for programming a memory arrangement and a correspondingly programmed memory arrangement. In particular, the present invention relates to a method for programming a read-only memory in which the programming occurs by selective setting of metal connections ("vias") between two metal layers.

BACKGROUND

Read-only memories (ROMs) are generally used for storing permanent programs or data for microprocessor systems. For example, the so-called BIOS of computer systems can be stored on such a ROM. Such ROMs are already programmed, i.e. set with data, during the production process. There are ROMs for which the programming takes place by interruption of diffusion layers (so-called "diffusion programmable ROM"). For another type of ROM, the programming takes place by selective setting of vertical metal connections (so-called "via programmable ROM" or "metal programmable ROM", generally "mask programmable ROM") between metal or other conducting layers. The latter type of ROMs has the advantage that the programming only occurs at a relatively late stage in the production process, so that there can be a common manufacturing process until this point for various ROMs to be programmed. Furthermore, the correction of faults in the planned programming is possible up to this production step relatively at the end of the process. Both types of ROMs are described for example in the U.S. patent application No. 2002/0039305 A1.

Another type of "via programmable ROM" is presented in FIGS. 3 and 4, FIG. 3 schematically showing a layout of such a ROM and FIG. 4 showing a schematic circuit diagram of the ROM from FIG. 3.

The ROM presented in FIG. 3 comprises—in a manner widely used for memory modules generally—a matrix of memory cells, in this case two columns each of four memory cells. As indicated in FIG. 3, either a value "0" or a value "1" can be stored in each memory cell. Naturally, memory modules in practice contain considerably more memory cells than the eight memory cells shown in FIG. 3, which are then correspondingly arranged in considerably more columns and rows, and optionally also over one another in several layers.

The functioning of the ROM will first be explained with reference to the schematic circuit diagram of FIG. 4, before returning to the implementation of the layout.

The individual memory cells are each implemented in the presented ROM by a transistor T1, T2, . . . , T8. Four word or address lines WL0, WL1, WL2 and WL3, each connected to the gates of two of the transistors T1–T8, are used for addressing the memory cells. For example, the address line WL0 is connected to the gates of the transistor T1 and the transistor T5.

The memory cells are then read over bit lines BL0 and BL1. For example, the address line WL0 and bit line BL0 are used for controlling and reading the transistor T1, while for controlling and reading the transistor T7 the address line WL2 and bit line BL1 are used. A specific combination of address and bit line thus uniquely determines the memory cell to be read.

The transistors T1–T8 are balanced in the layout, meaning that source and drain contact are in principle identical and thus interchangeable. The source and drain contacts of the transistors arranged in a column (T1–T4 or T5–T8) are connected to one another as shown. Connection lines 2A, 2B, . . . , 2J are further provided, which are provided between the individual transistors and at the beginning and end of each column, and connected as shown. The totality of the connection lines 2A–2J is denoted in the following simply with the reference label 2. Each of the connection lines 2 is connected either to one of the bit lines BL0, BL1 or to a potential line 6. In the example shown, the potential line 6 is for example a virtual negative potential line ("virtual VSS"). Virtual in this context means that the potential line 6 is on a positive supply voltage in an "idle state". If a memory cell in the corresponding column of the ROM is read, the corresponding potential line 6 is connected to negative supply voltage.

Furthermore, in a normal state of the circuit, the bit lines BL0 and BL1 for example are on the negative supply voltage. To read a memory cell, the bit line of the corresponding circuit is connected to the positive supply voltage, which represents the logical state "1".

If the memory cell formed by the transistor T1 is now to be read, for example, the left potential line 6 in FIG. 4 is initially connected to the negative supply voltage and the bit line BL0 to the positive supply voltage. The address line WL0 is then switched from negative to positive supply voltage, so that the transistor T1 becomes conductive. A current can thus flow over the connection line 2A, the transistor T1 and the connection line 2B from the left potential line 6 to the bit line BL0. The bit line BL0 is thereby drawn to negative supply voltage, which corresponds to a logical "0" and thus to the contents of the memory cell formed by the transistor T1.

In contrast, if the transistor T6, which has a stored logical "1", is read, no current can flow from the right potential line 6 to the bit line BL1, as neither the connection line 2G nor the connection line 2H is connected to the bit line BL1. A current over the transistor T5 which in this case is realized as field-effect transistors for example can likewise not flow, as the address line WL0 remains on negative supply voltage; only the address line WL1 is switched from negative to positive supply voltage, in order to read the transistor T6.

Naturally, it is possible in principle to swap the polarity of the transistors T1–T8, and simultaneously change the potential used for the reading on the address lines WL0–WL3. In the same way it is feasible, in principle, before the reading to connect the corresponding bit line to negative supply voltage and the corresponding potential line 6 to positive supply voltage, which would mean the reverse memory state in each case for the respective transistors.

In the layout of FIG. 3 corresponding to the circuit diagram of FIG. 4, the lowest layer is formed by two diffusion layers 1A, 1B, in other words by doped semiconductor layers, preferably silicon, to form a semiconductor part of the transistors T1–T8 from FIG. 4. Above this run the address lines WL0–WL3, which are formed for example from polysilicon, preferably from high-doped polycrystalline silicon, and serve as a gate for the transistors T1–T8. For example, when an address line is on negative supply voltage VSS, the section of the diffusion layer 1A or 1B underlying the respective address line is nonconductive. If the corresponding address line WL0–WL3 is on positive supply voltage VDD, the section of the diffusion layer 1A or 1B underlying the respective address line becomes conductive.

A first metal layer comprises the connection lines 2 in the form of metal sections. These are connected with electrical conductivity by metal contacts 3A–3J to the diffusion layer, and form source and drain contacts of the transistors T1–T8. As already mentioned, these transistors are balanced in the layout, meaning that there is no fixed source or drain contact. The source and drain contacts are also divided for the transistors in the FIG. 3 layout. Thus, the connection lines 2A and 2B represent source and drain contacts of the transistor T1, and the connection lines 2B and 2C are the source and drain contacts of the transistor T2. The connection line 2B is thus a contact of both the transistor T1 and the transistor T2.

A second metal layer contains the bit lines BL0 and BL1, and the potential lines 6. The first metal layer is separated from the second metal layer by a suitable insulation, for example of silicon dioxide.

Metal connections 7 ("vias") connect the lines 2 at desired points to the potential line 6, metal connections 8 ("vias") connect the bit lines BL0 and BL1 to the lines 2. The metal connections 7 and 8 are set such that the corresponding programming of the ROM is achieved. As can be seen especially for the right of the potential lines 6, the metal sections 2G–2J, which represent contacts of the transistors T6–T8 programmed to "1", are connected to the potential line 6, so that these metal sections are on a defined potential.

Such a layout is also called "wide cell" architecture, since relatively short bit lines BL0 and BL1 are implemented here—by the use of common connection lines 2 for two transistors at a time, among other things—so that there is a relatively wide cell in the view of FIG. 3. This implementation is especially suitable for ROMs that are to be operated with low voltage. Layouts in which the bit lines are conversely longer than the address lines are called "tall cells".

The ROM shown in FIG. 3 and 4 has the disadvantage that couplings can occur between individual memory cells or the bit lines, so that when a "1" is read, an adjacent programmed "0" can influence the read result. This coupling is due to parasitic capacitances, of the bit lines for example.

BRIEF SUMMARY

By way of introduction only, in one embodiment of the invention, a memory arrangement is provided. The memory arrangement comprises memory cells, address lines, bit lines and a potential line. Each memory cell contains a transistor with contacts. For a memory cell programmed in a first memory state, one of the contacts of the transistor is connected to a respective assigned bit line and another of the contacts is connected to the potential line. For a memory cell programmed in a second memory state no connections of the contacts of the respective transistor to a bit line or the potential line are provided. The memory arrangement can be a read-only memory or ROM.

The first memory state can correspond to a logical "0", for example, and the second memory state to a logical "1". The contacts of transistors whose memory cells were programmed in accordance with the second memory state are thus connected neither to the bit lines nor to the potential line, i.e. they are "floating". Floating does not impair of the functioning of the memory, and, on the contrary, helps to reduce a capacitance of the bit lines, so that crosstalk between different memory cells is reduced.

Transistors of at least two of the memory cells have a common contact. This achieves a more compact arrangement with shorter bit lines. The connections which achieve programming of one of the memory cells in accordance with the first memory state may be metal connections, which are made during production of the memory arrangement.

The memory cells may be arranged in a matrix, with the address lines running in one direction and the bit lines in a perpendicular direction. In such a layout, several potential lines are provided, which run parallel to and alternate with the bit lines. Each pair of adjacent bit lines are thus shielded from each other by a potential line between them, and crosstalk between the bit lines can thereby be avoided.

The potential line can, for example, be on a negative supply voltage or a ground potential, but can also be a virtual line, which is only brought to the desired potential immediately before a read operation.

In one embodiment of the method according to the invention, for programming one of the memory cells in accordance with the first memory state, one of the contacts of the transistor is connected to one of the bit lines and another of the contacts of the transistor is connected to the potential line, while for programming a memory cell in accordance with the second memory state, no connections are established.

BRIEF DESCRIPTION OF THE DRAWINGS

The invention will be further described on the basis of a preferred embodiment, with reference to the attached drawings in which:

FIG. 1 shows a schematic layout of a memory arrangement according to one embodiment of the invention;

FIG. 2 is a circuit diagram corresponding to the arrangement of FIG. 1;

DETAILED DESCRIPTION

FIG. 1 shows a layout of a read-only memory or ROM embodiment of the present invention. FIG. 2 shows a corresponding circuit diagram. In FIGS. 1 and 2, similar reference labels are used to indicate similar components as those shown in FIGS. 3 and 4.

The ROM shown in FIGS. 1 and 2 comprises eight memory cells, which are arranged in two columns of four memory cells each and are formed by transistors T1–T8 as shown in the circuit diagram of FIG. 2. Naturally, ROMs used in practice contain considerably more of such memory cells, which can be arranged in more columns and rows and optionally also over one another in several layers.

The transistors T1–T8 from FIG. 2 are field-effect transistors in the embodiment shown, but in principle the use of other transistor types is also conceivable. The gate terminals of the transistors T1–T8 are connected to address lines WL0–WL3 as shown in FIG. 2; that is, two transistors are assigned one address line in each case. The source and drain contacts of the transistors T1–T8 are connected to connection lines 2A–2J. The totality of connection lines 2A–2J is referred to in the following simply as "connection lines 2", if no specific connection line is meant.

The transistors T1–T8 are balanced in the layout, meaning that source and drain contact are interchangeable. The connection lines 2B–2D and 2G–2I are each assigned to two transistors, of which in each case one contact is connected to the respective connection line as shown in FIG. 2.

Figure 4:
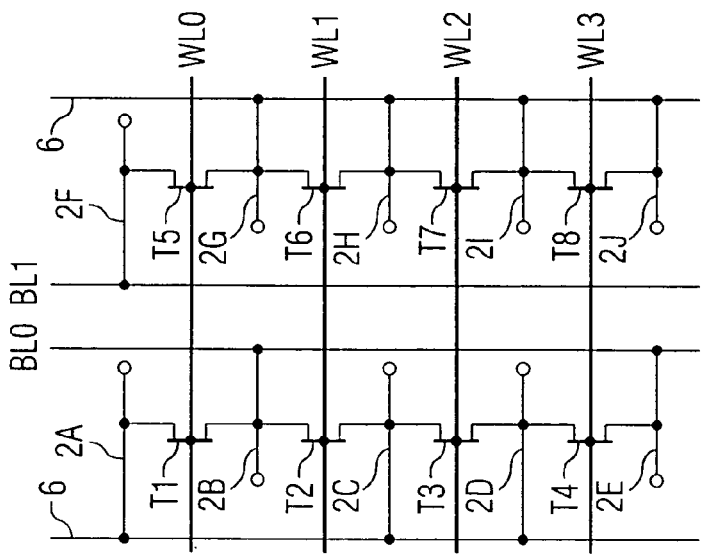
FIG. 4 is a circuit diagram corresponding to the layout of FIG. 3.
Figure 3:
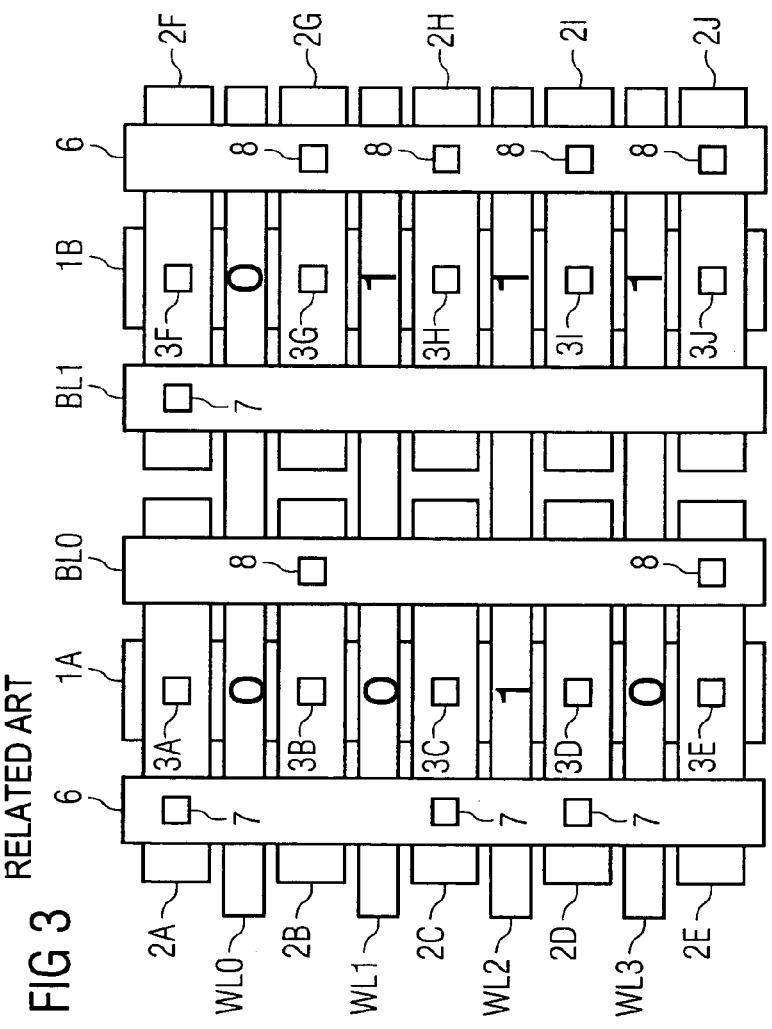
FIG. 3 shows a layout of a ROM according to prior art.

Two bit lines BL0 and BL1 and two potential lines VSS0 and VSS1 are further provided. In contrast to the ROM of FIGS. 3 and 4, these lines are potential lines, which are constantly on negative supply voltage VSS. In principle, however, virtual potential lines as for the known ROM from FIG. 3 and 4 are also possible.

The connection lines 2 are either connected to one of the potential lines VSS0, VSS1, or to one of the bit lines BL0 and BL1, or connected to neither of the two lines. In the present embodiment, the connection lines 2H, 2I and 2J are connected neither to the potential line VSS1 nor to the bit line BL1, so are floating in contrast to the corresponding lines shown in FIG. 4. A parasitic capacitance of the bit lines is thereby reduced, a danger of crosstalk between adjacent memory cells consequently being reduced.

In the present embodiment, the memory cells which contain the transistors T1, T2, T4 and T5 are programmed to the logical state "0", and the other memory cells are programmed to the logical state "1".

To read the memory cell containing the transistor T1, for example, the bit line BL0 is set to a positive supply voltage VDD (corresponding to logical "1"). The address line WL0 is then switched from its idle state, in which it is on a negative supply voltage VSS, to the positive supply voltage VDD. This causes the transistor T1 (and the transistor T5) to become conductive, and consequently a current can flow between the supply voltage VSS0 and the bit line BL0, over the connection line 2A, the transistor T1 and the connection line 2B. The bit line BL0 is thus drawn to the negative supply voltage corresponding to logical "0", which corresponds to the programmed state of the memory cell containing the transistor T1.

Conversely, if for example the memory cell containing the transistor T7 is to be read, the bit line BL1 is correspondingly set to VDD. The address line WL2 is then switched from negative supply voltage VSS to positive supply voltage VDD, causing the transistor T7 to become conductive. However, no current can flow between the supply voltage VSS1 and the bit line BL1, as the connection lines 2H and 2I are floating. The bit line BL1 accordingly remains on the potential VDD corresponding to logical "1", which corresponds to the programmed state of the memory cell containing the transistor T7.

FIG. 1 shows a schematic layout corresponding to the circuit diagram of FIG. 2. The layout comprises diffusion layers 1A, 1B, a first metal layer, in which the connection lines 2 are configured in the form of metal sections, and the address lines WL0–WL3 preferably made of polycrystalline silicon. The connection lines 2 are connected to the diffusion layer 1A or 1B with metal connections ("vias") 3 (3A–3J). These elements correspond to the elements already precisely described with reference to FIG. 3 in the introductory part of the specification, and the description there applies equally to the embodiment according to the invention.

In a second metal layer, the potential lines VSS0 and VSS1 and the bit lines BL0 and BL1 are arranged so that they run perpendicularly to the address lines WL0–WL3. In contrast to the conventional ROM presented in FIG. 3, the potential lines VSS0, VSS1 and the bit lines BL0, BL1 are arranged alternately. This has the advantage that the bit lines BL0 and BL1 are further removed from each other, and the potential line VSS1 between them effects a shielding of the bit lines BL0 and BL1 from each other. The danger of crosstalk between the bit lines is consequently greatly reduced.

The potential lines VSS0 and VSS1 are electrically connected by metal contacts 4A, 4C, 4D and 4F to the connection lines 2A, 2C, 2D and 2F respectively. The bit lines BL0 and BL1 are electrically connected by metal contacts 5B, 5E and 5G to the connection lines 2B, 2E and 2G. The circuit diagram shown in FIG. 2 is thus implemented by the layout of FIG. 1. In particular, in contrast to prior art the connection lines 2H, 2I and 2J are floating, i.e. they are connected neither to the potential line VSS1 nor to the bit line BL1. This results in a lower parasitic capacitance of the bit line BL1, which reduces crosstalk between the adjacent memory cells.

The ROM of FIGS. 1 and 2 should naturally be seen as an example only, which can be modified or adapted in a variety of ways. For example, it is possible to implement the memory module using semiconductors other than silicon. The address lines WL0–WL3 can also in principle be made of metal instead of polycrystalline silicon. As already explained in the introductory part of the specification with reference to FIG. 3 and FIG. 4, the polarities can be interchanged, so that the memory cells discussed above programmed to the logical "0" are instead programmed to logical "1" and conversely. Finally, memory arrangements other than ROMs may be used; for repeatedly programmable modules, the permanent metal connections 4A–4F and 5B–5G are replaced with switchable or adjustable connections.

Although the present invention has been explained by way of the examples described above, it should be understood to the ordinary skilled person in the art that the invention is not limited to the examples, but rather that various changes or modifications thereof are possible without departing from the spirit of the invention. Accordingly, the scope of the invention shall be determined only by the appended claims and their equivalents.

We claim:

1. A memory arrangement comprising:
    a plurality of memory cells, each memory cell having a transistor and a plurality of memory states;
    a plurality of address lines connected to the memory cells;
    a plurality of bit lines connected to the memory cells; and
    a potential line connected to the memory cells,
    wherein for at least one memory cell in a first memory state, a first contact of the transistor is connected to a bit line assigned to the memory cell and a second contact of the transistor is connected to the potential line, and
    for at least one memory cell in a second memory state, no connection exists between the contacts of the transistor and the bit lines or the potential line.

2. The memory arrangement according to claim 1, wherein the first memory state corresponds to a logical "0" and the second memory state corresponds to a logical "1".

3. The memory arrangement according to claim 1, wherein the memory cells are arranged in a matrix, a number of the address lines corresponds to a number of the rows of the matrix, the address lines run in a direction of the rows of the matrix, a number of the bit lines corresponds to a number of the columns of the matrix, and the bit lines run in a direction of the columns of the matrix.

4. The memory arrangement according to claim 3, wherein the potential lines and bit lines are equal in number, are parallel, and alternate.

5. The memory arrangement according to claim 1, wherein the potential line runs between an adjacent pair of the bit lines.

6. The memory arrangement according to claim 1, wherein the transistors of adjacent memory cells have a common contact.

7. The memory arrangement according to claim 1, wherein the contacts of the transistors include metal sections.

8. The memory arrangement according to claim 1, wherein at least one of the bit lines or the potential line is a metal line.

9. The memory arrangement according to claim 1, wherein connections of the contacts of the transistors of the memory cells with the first memory state to the assigned bit line and the potential line are metal connections.

10. The memory arrangement according to claim 1, wherein the memory arrangement is a read-only memory.

11. A method of programming a memory arrangement comprising memory cells, address lines, bit lines, and a potential line, the method comprising:
for programming of a first memory cell into a first memory state, connecting a first contact of a transistor of the first memory cell to a bit line assigned to the first memory cell and connecting a second contact of the transistor of the first memory cell to the potential line;
for programming of a second memory cell into a second memory state, preventing establishment of any connection between contacts of a transistor of the second memory cell and a bit line assigned to the second memory cell or the potential line.

12. The method according to claim 11, wherein the connections for the programming of the first memory cell are metal connections.

13. The method according to claim 11, wherein the memory arrangement is a read-only memory.

14. The method according to claim 11, wherein programming of the memory cells is executed during production of the memory arrangement.

15. A memory arrangement comprising:
a plurality of memory cells;
a plurality of address lines connected to the memory cells;
a plurality of bit lines connected to the memory cells; and
a potential line connected to the memory cells,
wherein during reading of the memory cells:
a transistor of a first memory cell in a first memory state has a first contact connected to a bit line assigned to the first memory cell and a second contact connected to a potential line assigned to the first memory cell, and
no electrical contact is present between a transistor of a second memory cell in a second memory state and either a bit line assigned to the second memory cell and or a potential line assigned to the second memory cell.

16. The memory arrangement according to claim 15, wherein:
the address lines are parallel;
the bit lines are parallel and perpendicular to the address lines; and
the potential line is parallel with the bit lines.

17. The memory arrangement according to claim 16, wherein a plurality of potential lines is present, the potential lines and the bit lines alternate.

18. The memory arrangement according to claim 16, wherein the memory cells are arranged in a matrix.

19. The memory arrangement according to claim 15, wherein at least one second memory cell is permanently unconnected to all bit lines and potential lines.

* * * * *